United States Patent
Stainsby et al.

(10) Patent No.: US 10,705,166 B2
(45) Date of Patent: Jul. 7, 2020

(54) TRANSMIT COIL FREQUENCY RESPONSE CORRECTION FOR MAGNETIC RESONANCE IMAGING

(71) Applicant: Synaptive Medical (Barbados) Inc., Bridgetown (BB)

(72) Inventors: Jeff Alan Stainsby, Toronto (CA); Chad Tyler Harris, Toronto (CA); Andrew Thomas Curtis, Toronto (CA); Alexander Gyles Panther, Toronto (CA)

(*) Notice: Subject to any disclaimer, the term of this patent is extended or adjusted under 35 U.S.C. 154(b) by 430 days.

(21) Appl. No.: 15/598,939

(22) Filed: May 18, 2017

(65) Prior Publication Data
US 2018/0335489 A1    Nov. 22, 2018

(51) Int. Cl.
G01R 33/36 (2006.01)
G01R 33/58 (2006.01)
G01R 33/483 (2006.01)
G01R 33/28 (2006.01)

(52) U.S. Cl.
CPC ....... *G01R 33/3607* (2013.01); *G01R 33/583* (2013.01); *G01R 33/288* (2013.01); *G01R 33/4833* (2013.01)

(58) Field of Classification Search
CPC .............. G01R 33/3607; G01R 33/583; G01R 33/288; G01R 33/4833
USPC ........................... 324/300–322; 600/407–435
See application file for complete search history.

(56) References Cited

U.S. PATENT DOCUMENTS

| | | | |
|---|---|---|---|
| 8,686,726 B2* | 4/2014 | Katscher | G01R 33/5659 324/307 |
| 9,253,751 B2 | 12/2016 | Harris | |
| 2011/0144474 A1* | 6/2011 | Ouwerkerk | A61B 5/055 600/410 |
| 2011/0163749 A1* | 7/2011 | Katscher | G01R 33/3415 324/307 |
| 2017/0102440 A1* | 4/2017 | Chen | A61B 5/055 |
| 2017/0261574 A1 | 9/2017 | Stainsby | |

(Continued)

FOREIGN PATENT DOCUMENTS

| | | |
|---|---|---|
| JP | 11-290288 A | 10/1999 |
| JP | 2014236868 A | 12/2014 |
| WO | 2006/067727 A2 | 6/2006 |

OTHER PUBLICATIONS

Search Report issued by the UK Intellectual Property Office dated Nov. 9, 2018 in relation to corresponding GB Application No. GB1807758.6, 3 pgs.

(Continued)

*Primary Examiner* — Dixomara Vargas
(74) *Attorney, Agent, or Firm* — Quarles & Brady LLP

(57) ABSTRACT

Methods for correcting a non-uniform power response of a radiofrequency ("RF") transmit coil used in magnetic resonance imaging ("MRI") are described. Transmit power response data for an RF transmit coil are processed to compute RF amplitude scaling factors for the RF transmit coil as a function of transmit frequency offset. The RF amplitude scaling factors can be used to correct transmitted RF power, and thus flip angle, to be more uniform over a range of transmit frequency offsets, as may be encountered when imaging with lower field MRI systems or MRI systems with high strength or asymmetric gradients.

16 Claims, 4 Drawing Sheets

(56) References Cited

U.S. PATENT DOCUMENTS

2018/0335489 A1* 11/2018 Stainsby ............ G01R 33/3607

OTHER PUBLICATIONS

Office Action issued by the Canadian Intellectual Property Office in relation to corresponding Canadian Patent Application No. 3,005,220 dated Mar. 18, 2019; 3 pgs.

* cited by examiner

TRANSMIT COIL FREQUENCY RESPONSE CORRECTION FOR MAGNETIC RESONANCE IMAGING

BACKGROUND

Radiofrequency ("RF") transmit coils used in magnetic resonance imaging ("MRI") are normally designed to be as efficient as possible, typically characterized by the "Q" of the coil. In particular, RF transmit coils are designed to be efficient at converting power that is provided to the coil into the transmitted RF power. In addition, RF transmit coils need to be tuned so that their peak efficiency occurs close to the expected resonance frequency of the resonant species that is to be investigated. For example, when imaging protons (i.e., the most commonly imaged resonant species), the RF transmit coil needs to be tuned to approximately 42.57 MHz per Tesla of the magnetic field strength of the MRI system's main magnetic field, $B_0$. However, the width of this resonant tuning also tends to scale with magnetic field strength, so that the RF transmit coil is efficient over a wider range of frequencies at higher magnetic field strengths, but is efficient over a smaller range of frequencies at lower magnetic field strengths.

In addition, when performing slice-selective excitations in normal MRI applications, when an off-center slice needs to be excited the transmitted RF pulse may need to be applied with an offset frequency from the nominal resonance frequency of the target resonant species. In these situations, the transmit frequency is offset based on the distance of the slice from center, the transmit bandwidth of the RF pulse (which is most commonly influenced by the duration of the RF pulse), and the strength of the applied slice-selective gradient. The net result is that for thin, off-center slices excited with short RF pulses, the RF excitation pulse may need to be transmitted at a large offset frequency.

Some MRI systems implement an asymmetric gradient design, in which the gradient does not produce a net zero field that coincides spatially with the magnet isocenter. In these systems, the asymmetric gradient acts like a nominal slice offset in the corresponding direction, which can require a large offset frequency even for slices excited at isocenter because of the additional non-zero gradient in the asymmetric gradient direction.

SUMMARY OF THE DISCLOSURE

The present disclosure addresses the aforementioned challenges by providing a method for producing an image with a magnetic resonance imaging ("MRI"). The method includes providing radiofrequency ("RF") amplitude scaling data to the MRI system. The RF amplitude scaling data contains RF amplitude scaling factors that define an RF amplitude scaling to apply for a particular transmit frequency. Data are acquired from a subject with the MRI system by performing a magnetic resonance pulse sequence that includes generating at least one RF pulse with an RF transmit coil. An amplitude of the at least one RF pulse is scaled using the provided RF amplitude scaling data to correct for a non-uniform transmit power response of the RF transmit coil. An image of the subject is reconstructed from the acquired data.

It is another aspect of the present disclosure to provide a method for computing RF scaling factors for correcting a non-uniform transmit power response of an RF transmit coil used in an MRI system. Transmit power response data for the RF transmit coil are provided to a computer system. The transmit power response data define an amount by which RF power transmitted by the RF transmit coil changes as a function of transmit frequency. RF amplitude scaling factors are computed with the computer system by computing a mathematical inverse of the transmit power response data. The RF amplitude scaling factors are stored in the computer system as RF amplitude scaling data for later use by the MRI system.

It is another aspect of the present disclosure to provide a method for producing RF transmit pulse waveforms for use with an MRI system that includes an RF transmit coil. Transmit power response data for the RF transmit coil are provided to a computer system. The transmit power response data defines an amount by which RF power transmitted by the RF transmit coil changes as a function of transmit frequency. RF amplitude scaling factors are computed with the computer system based at least in part on the transmit power response data. An RF transmit pulse waveform is generated based at least in part on a pulse duration selected with the computer system, a transmit frequency selected with the computer system, and an amplitude selected with the computer system and scaled using the RF amplitude scaling factor associated with the selected transmit frequency.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are methods for correcting a non-uniform power response of a radiofrequency ("RF") transmit coil used in magnetic resonance imaging ("MRI"). As described above, when imaging a subject using an MRI system with a low main magnetic field strength (e.g., less than 1.5 T), an asymmetric gradient design, or both, the transmit frequencies used to excite off-center slices may be offset from the tuned resonance of the RF transmit coil by a degree sufficient to result in significant transmit power reduction. The methods described in the present disclosure address this problem with variable transmit power (and thus variable flip angle) as a function of transmit offset frequency.

This problem described above can often occur in MRI systems with lower main magnetic field strengths (e.g., less than 1.5 T), high gradient strengths, asymmetric gradients, large transmit bandwidths, and combinations thereof.

Figure 1:
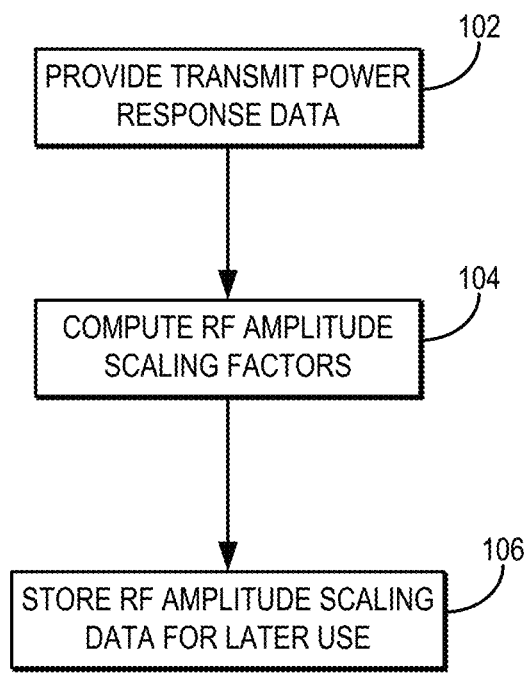
FIG. 1 is a flowchart setting forth the general steps of an example method for computing and storing radiofrequency ("RF") amplitude scaling factors computed from transmit power response data for an RF transmit coil.

Referring now to FIG. 1, a flowchart is illustrated as setting forth the steps of an example method for correcting, or otherwise compensating, for a non-uniform power response of an RF transmit coil.

Figure 2:
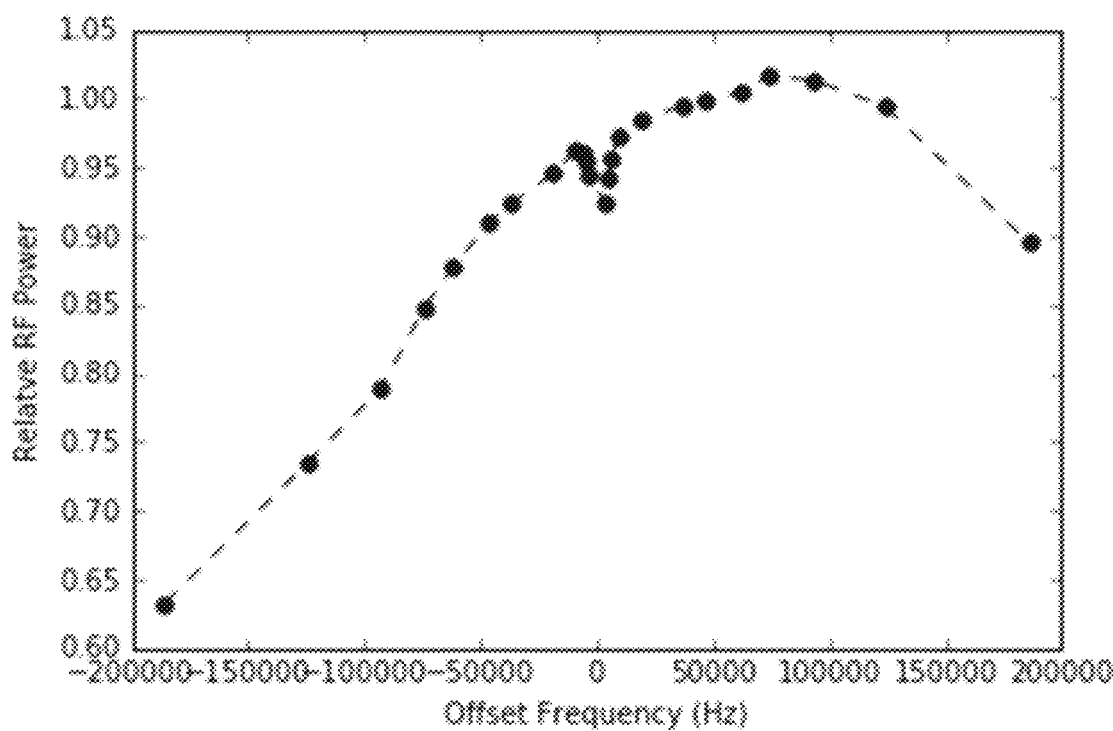
FIG. 2 shows an example of transmit power response data for an RF transmit coil.

The method includes providing to a computer system transmit power response data for an RF transmit coil, as indicated at step 102. Providing the transmit power response data can include retrieving previously measured, or otherwise characterized, transmit power response data from a memory or data storage, or can include measuring or otherwise characterizing the transmit power response with the computer system. In general, the transmit power response of the RF transmit coil is measured, or otherwise characterized, as a function of transmit frequency. The transmit power response data thus provides the amount by which the transmitted RF power changes as a function of transmit frequency. An example of transmit power response data is shown in FIG. 2.

The transmit power response data can be measured, for example, by measuring the peak RF power for a given RF transmit coil at a particular offset frequency. A series of such measurements can be made while varying to offset frequency to provide a measurement of the transmit power response as a function of transmit frequency. In some instances, a different set of transmit power response data can be measured for different main magnetic field strength ($B_0$) values. Although changing the strength of the main magnetic field may not change the transmit power response of the RF transmit coil, the range of relevant transmit frequencies over which the transmit power response is measured will be different depending on the main magnetic field strength. Thus, different transmit power response data can be measured over different transmit frequency ranges depending on the main magnetic field strength that will be used. This approach is particularly useful for MRI systems that are able to rapidly ramp their main magnetic field strength, such as the MRI system described in co-pending U.S. patent application Ser. No. 15/128,881, which is herein incorporated by reference in its entirety.

Figure 3:
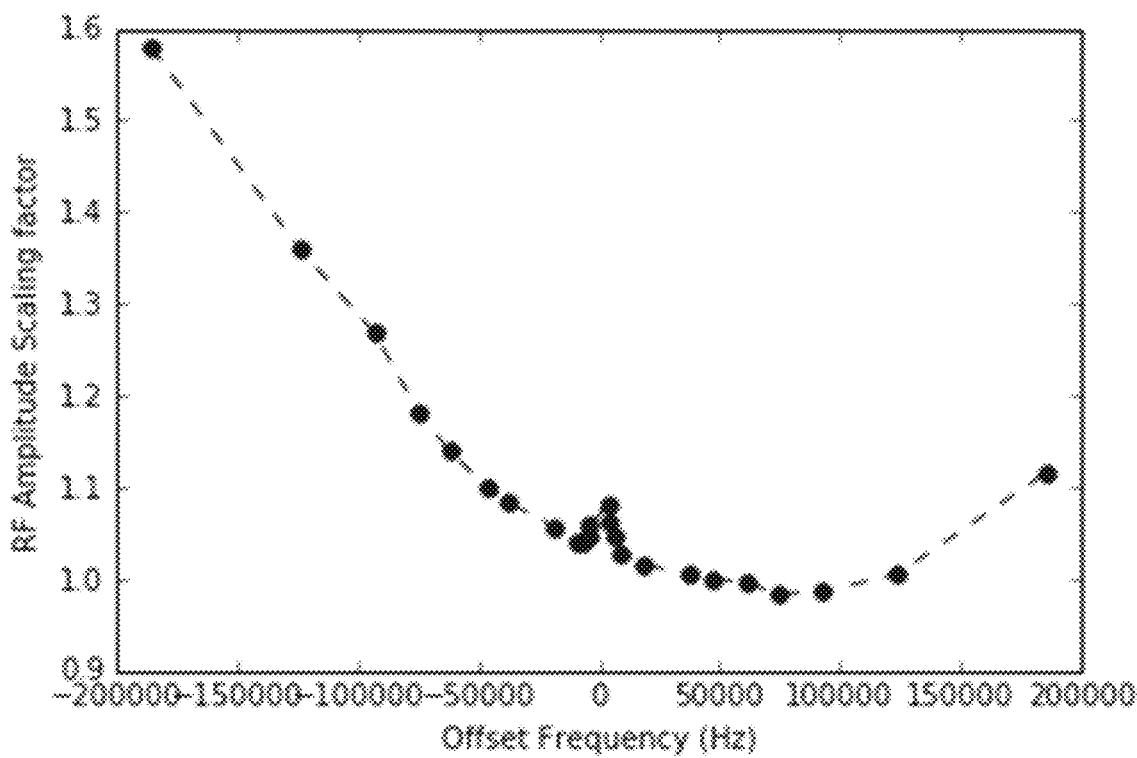
FIG. 3 shows an example of the inverse of the transmit power response data of FIG. 2.

Referring still to FIG. 1, the method for correcting, or otherwise compensating, for a non-uniform power response of an RF transmit coil proceeds by computing RF amplitude scaling factors based at least in part on the provided transmit power response, as indicated at step 104. As one example, the RF amplitude scaling factors can be computed by computing the inverse of the transmit power response. An example of RF amplitude scaling factors is shown in FIG. 3.

The RF amplitude scaling factors are then stored for later use as RF amplitude scaling data, as indicated at step 106. These RF amplitude scaling data can be used to adjust the implementation of RF pulses (e.g., RF excitation pulses) using in an MRI pulse sequence to provide for more uniform RF transmit power. It will be appreciated that RF amplitude scaling data can be generated and stored for multiple different RF transmit coils, such that the appropriate data can be retrieved when a particular RF transmit coil will be used.

Figure 4:
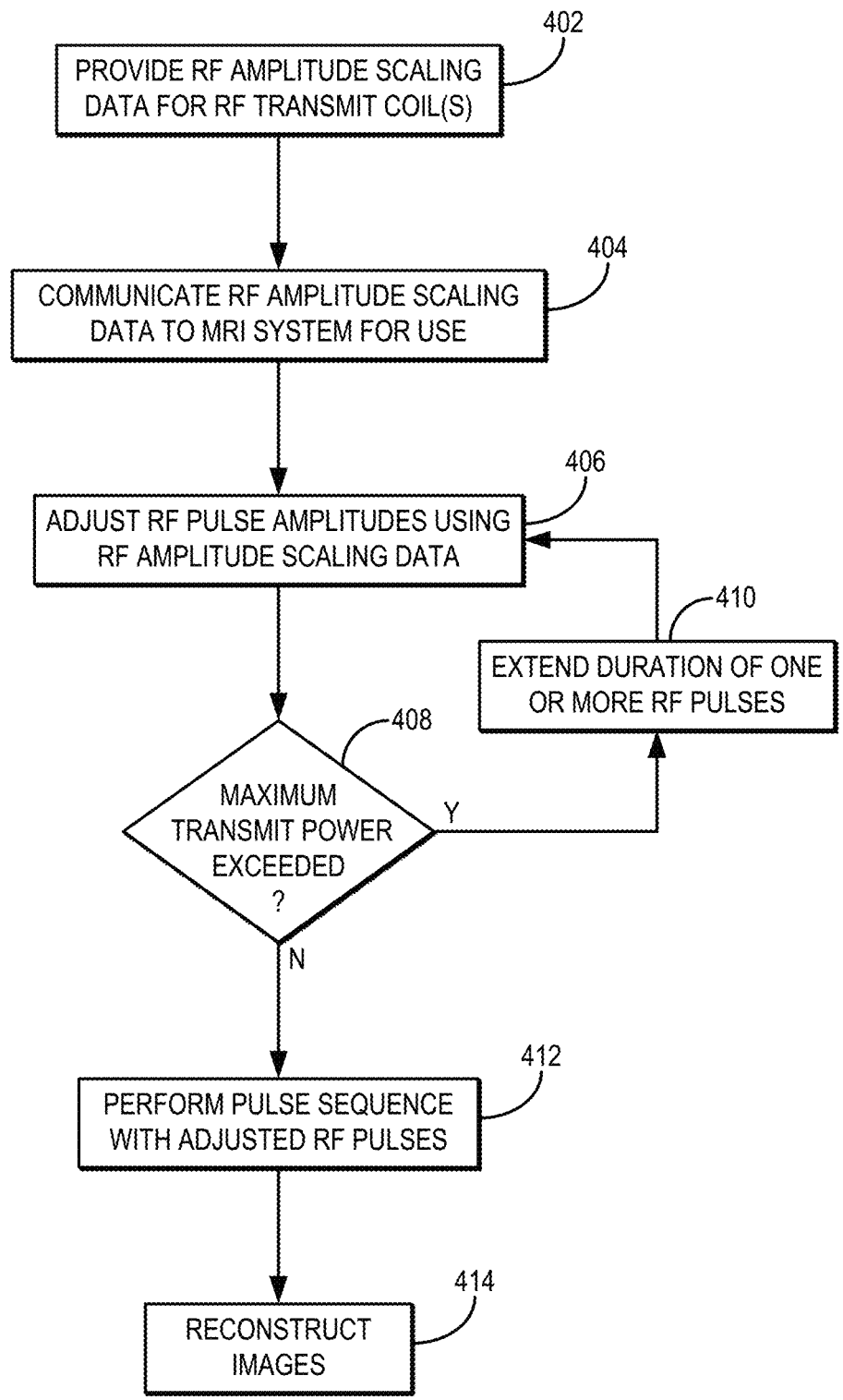
FIG. 4 is a flowchart setting forth the steps of an example method for correcting an RF transmit coil for a non-uniform transmit power response using RF amplitude scaling factors, such as those computed using the general method of FIG. 1.

Referring now to FIG. 4, a flowchart is illustrated as setting forth the steps of an example method for operating an RF transmit coil in an MRI system in a manner that results in more uniform RF transmit power. The method includes providing to the MRI system, RF amplitude scaling data, as indicated at step 402. Providing the RF amplitude scaling data can include retrieving previously generated RF amplitude scaling data (e.g., RF amplitude scaling data generated using the methods described in the present disclosure) from a memory or other data storage, or by generating such data using the methods described in the present disclosure.

The provided RF amplitude scaling data are then communicated to the MRI system for use during a pulse sequence, as indicated at step 404. For instance, the RF amplitude scaling data can be communicated to an RF system or subsystem of the MRI system. The MRI system then uses the RF amplitude scaling factors stored in the RF amplitude scaling data to adjust the amplitude of RF pulses (e.g., RF excitation pulses) in the pulse sequence, as indicated at step 406. For instance, the RF system or subsystem uses the RF amplitude scaling data to request higher RF power for pulses at higher offset frequencies, so as to make all RF pulses have the same flip angle, regardless of offset frequency. This can be achieved by scaling the requested RF pulse amplitude by the appropriate RF amplitude scaling factor based on the desired transmit frequency offset.

If the maximum transmit coil power is exceeded after this correction (e.g., whether a maximum threshold value is exceeded), as determined at decision block 408, then the RF pulse duration for each pulse that exceeds the maximum coil power can be extended until peak power limits are satisfied, as indicated at step 410. In some implementations, if the maximum transmit coil power is exceeded by one or more RF pulse, then the RF pulse duration of all of the RF pulses can also be extended. As a result of extending the RF pulse duration, the required offset frequency for the RF pulse is reduced, which in turn reduces the amount to scale the transmit power. The adjusted RF pulse waveforms (e.g., the scaled amplitudes, extended pulse durations) are then used by the MRI system to generate the desired RF fields during a pulse sequence to acquire magnetic resonance data from a subject, as indicated at step 412. One or more images of the subject can then be reconstructed from the acquired data, as indicated at step 414. The reconstructed images can be displayed to a user or stored for additional processing or later use.

Figure 5:
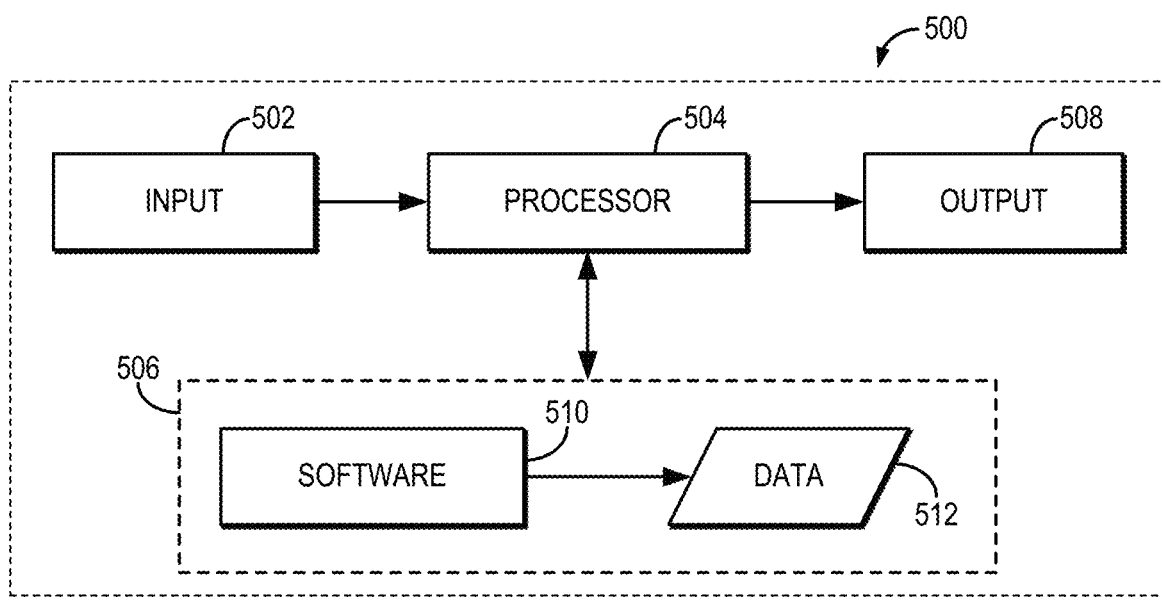
FIG. 5 is a block diagram of an example computer system that can implement the methods described in the present disclosure.

Referring now to FIG. 5, a block diagram of an example computer system 500 that can perform the methods described in the present disclosure is shown. The computer system 500 is generally implemented with a hardware processor 504 and a memory 506.

The computer system 500 includes an input 502, at least one hardware processor 504, a memory 506, and an output 508. The computer system 500 may be implemented, in some examples, by a workstation, a notebook computer, a tablet device, a mobile device, a multimedia device, a network server, a mainframe, or any other general-purpose or application-specific computing device. The computer system 500 may operate autonomously or semi-autonomously, or may read executable software instructions from the memory 506 or a computer-readable medium (e.g., a hard drive, a CD-ROM, flash memory), or may receive instructions via the input 502 from a user, or any another source logically connected to a computer or device, such as another networked computer or server. In general, the computer system 500 is programmed or otherwise configured to implement the methods and algorithms described above.

The input 502 may take any suitable shape or form, as desired, for operation of the computer system 500, including the ability for selecting, entering, or otherwise specifying parameters consistent with performing tasks, processing data, or operating the computer system 500. In some aspects, the input 502 may be configured to receive data, such as transmit power response data for an RF transmit coil. Such data may be processed as described above to compute RF amplitude scaling factors for use in correcting a non-uniform transmit power response of the RF transmit coil. In addition, the input 502 may also be configured to receive any other data or information considered useful for computing such RF amplitude scaling factors, or for generating or correcting RF transmit pulse waveforms using the RF amplitude scaling factors.

Among the processing tasks for operating the computer system 500, the at least one hardware processor 504 may also be configured to carry out any number of post-processing steps on data received by way of the input 502.

The memory 506 may contain software 510 and data 512, such as transmit power response data for an RF transmit coil, and may be configured for storage and retrieval of processed information, instructions, and data to be processed by the at least one hardware processor 504. In some aspects, the software 510 may contain instructions directed to computing RF amplitude scaling factors. The memory 506 may also contain data 512 in the form of RF amplitude scaling factors that have been computed for a particular RF transmit coil.

In addition, the output 508 may take any shape or form, as desired, and may be configured for displaying, in addition to other desired information, reconstructed signals or images.

Figure 6:
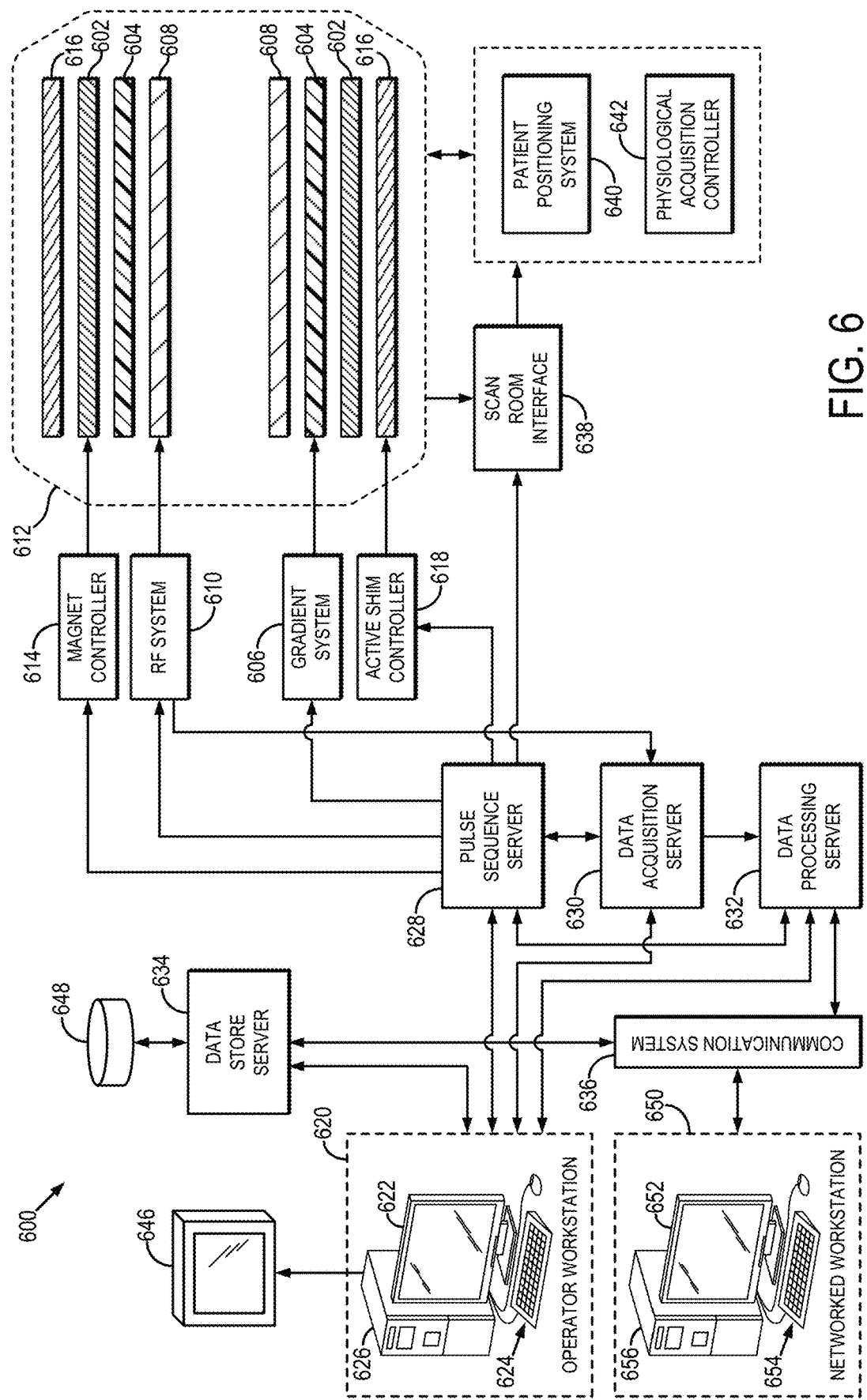
FIG. 6 is a block diagram of an example magnetic resonance imaging ("MRI") system that can implement the methods described in the present disclosure.

Referring particularly now to FIG. 6, an example of an MRI system 600 that can implement the methods described here is illustrated. The MRI system 600 includes a magnet assembly 602 that generates a main magnetic field, $B_0$, which may also be referred to as a polarizing magnetic field. The MRI system 600 also includes a gradient coil assembly 604 containing one or more gradient coils, which is controlled by a gradient system 606, and a radiofrequency ("RF") coil assembly 608 containing one or more RF coils, which is controlled by an RF system 610.

The RF coil assembly 608 can include one or more RF coils that are enclosed within a housing 612 of the MRI system 600, or can include one or more RF coils that are physically separate from the housing 612, such as local RF coils that can be interchangeably positioned within the bore of the MRI system 600. Similarly, the gradient coil assembly 604 can include one more gradient coils that are enclosed within the housing 612 of the MRI system 600, or can include one or more gradient coils that are physically separate from the housing 612 and that can be interchangeably positioned within the bore of the MRI system 600. The housing 612 may be sized to receive a subject's body, or sized to receive only a portion thereof, such as a subject's head.

The magnet assembly 602 generally includes a superconducting magnet that is formed as one or more magnet coils made with superconducting wire, high temperature superconducting ("HTS") wire, or the like. The one or more magnet coils can be arranged as a solenoid, a single-sided magnet, a dipole array, or other suitable configuration. The superconducting magnet can be cooled using a liquid or gaseous cryogen, as is known in the art, or can be cooled using a cryogen-free arrangement. In the latter example, the superconducting magnet can be cooled using a mechanical cryocooler, such as a Gifford-McMahon or pulse tube cryocooler. In some other configurations, the magnet assembly 602 can include one or more electromagnets, resistive magnets, or permanent magnets. For example, the magnet assembly 602 could include a Halbach array of permanent magnets.

In some configurations, the magnet assembly 602 includes a superconducting magnet that can be rapidly ramped from a first magnetic field strength to a second magnetic field strength. In these instances, the MRI system 600 can include a magnet controller 614 that controls the ramping of the main magnetic field, $B_0$. An example of such a controller is described in co-pending U.S. patent application Ser. No. 15/128,881, which is herein incorporated by reference in its entirety.

As will be described, the RF coil assembly 608 generates one or more RF pulses that rotate magnetization of one or more resonant species in a subject or object positioned in the main magnetic field, $B_0$, generated by the magnet assembly 602. In response to the one or more transmitted RF pulses, magnetic resonance signals are generated, which are detected to form an image of the subject or object. The gradient coil assembly 604 generates magnetic field gradients for spatially encoding the magnetic resonance signals. Collectively, the one or more RF pulses and the one or more magnetic field gradients define a magnetic resonance pulse sequence.

In some configurations, the MRI system 600 can also include a shim coil assembly 616. The shim coil assembly 616 can include passive shims, active shims, or combinations thereof. Active shims can include active shim coils that generate magnetic fields in order to shim, or reduce inhomogeneities, in the main magnetic field, $B_0$, generated by the magnet assembly 602. In some configurations, the active shim coils are controlled by an active shim controller 618. The active shim coils may include adaptive shim coils, such as those described in U.S. Pat. No. 9,523,751, which is herein incorporated by reference in its entirety.

The MRI system 600 includes an operator workstation 620 that may include a display 622, one or more input devices 624 (e.g., a keyboard, a mouse), and a processor 626. The processor 626 may include a commercially available programmable machine running a commercially available operating system. The operator workstation 620 provides an operator interface that facilitates entering scan parameters into the MRI system 600. The operator workstation 620 may be coupled to different servers, including, for example, a pulse sequence server 628, a data acquisition server 630, a data processing server 632, and a data store server 634. The operator workstation 620, the pulse sequence server 628, the data acquisition server 630, the data processing server 632, and the data store server 634 may be connected via a communication system 636, which may include wired or wireless network connections.

The pulse sequence server 628 functions in response to instructions provided by the operator workstation 620 to operate the gradient system 606 and the RF system 610. Gradient waveforms for performing a prescribed scan are produced and applied to the gradient system 606, which then excites gradient coils in the gradient coil assembly 604 to produce the magnetic field gradients (e.g., $G_x$, $G_y$, and $G_z$ gradients) that are used for spatially encoding magnetic resonance signals.

RF waveforms are applied by the RF system 610 to the RF coil assembly 608 to generate one or more RF pulses in accordance with a prescribed magnetic resonance pulse sequence. Magnetic resonance signals that are generated in response to the one or more transmitted RF pulses are detected by the RF coil assembly 608 and received by the RF system 610. The detected magnetic resonance signals may be amplified, demodulated, filtered, and digitized under direction of commands produced by the pulse sequence server 628.

The RF system 610 includes an RF transmitter for producing a wide variety of RF pulses used in magnetic resonance pulse sequences. The RF transmitter may include a single transmit channel, or may include multiple transmit channels each controlling a different RF transmit coil. The RF transmitter is responsive to the prescribed scan and direction from the pulse sequence server 628 to produce RF pulses of the desired frequency, phase, and pulse amplitude waveform. The generated RF pulses may be applied to the RF coil assembly 608, which as described above may include one or more RF coils enclosed in the housing 612 of the MRI system 600 (e.g., a body coil), or one or more RF coils that are physically separate from the housing 612 (e.g., local coils or coil arrays).

The RF system 610 also includes one or more RF receiver channels. An RF receiver channel includes an RF preamplifier that amplifies the magnetic resonance signal received by the RF coil in the RF coil assembly 608 to which the receiver channel is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \tag{1}$$

and the phase of the received magnetic resonance signal may also be determined according to the following relationship:

$$\varphi = \tan^{-1}\left(\frac{Q}{I}\right). \tag{2}$$

The pulse sequence server 628 may also connect to a magnet controller 614 that can be operated to ramp the main magnetic field, $B_0$, generated by the magnet assembly 602 from a first magnetic field strength to a second magnetic field strength. As one non-limiting example, the first magnetic field strength can be 0 T and the second magnetic field strength can be 0.5 T.

When the MRI system 600 includes a shim assembly 616 having one or more active shim coils, the pulse sequence server 628 can also connect to an active shim controller 618 to apply shim coil waveforms for generating magnetic fields to shim the main magnetic field, $B_0$, generated by the magnet assembly 602. In some example, the active shim coils can include adaptive shim coils. Adaptive shim coils can be used to shim the main magnetic field, $B_0$, and also to generate magnetic fields that can be used for spatially encoding magnetic resonance signals. In such instances, the pulse sequence server 628 can provide waveforms to the active shim controller 618 in order to generate such magnetic fields in accordance with a magnetic resonance pulse sequence.

The pulse sequence server 628 may also connect to a scan room interface 638 that can receive signals from various sensors associated with the condition of the subject or object being imaged, the magnet assembly 602, the gradient coil assembly 604, the RF coil assembly 608, the shim assembly 616, or combinations thereof. In one example, the scan room interface 638 can include one or more electrical circuits for interfacing the pulse sequence server 628 with such sensors. Through the scan room interface 638, a patient positioning system 640 can receive commands to move the subject or object being imaged to desired positiApplication-ons during the scan, such as by controlling the position of a patient table.

The pulse sequence server 628 may also receive physiological data from a physiological acquisition controller 642 via the scan room interface 638. By way of example, the physiological acquisition controller 642 may receive signals from a number of different sensors connected to the subject, including electrocardiograph ("ECG") signals from electrodes, respiratory signals from a respiratory bellows or other respiratory monitoring devices, and so on. These signals may be used by the pulse sequence server 628 to synchronize, or "gate," the performance of the scan with the subject's heart beat or respiration.

Digitized magnetic resonance signal samples produced by the RF system 610 are received by the data acquisition server 630 as magnetic resonance data, which may include k-space data. In some scans, the data acquisition server 630 passes the acquired magnetic resonance data to the data processing server 632. In scans that implement information derived from the acquired magnetic resonance data to control further performance of the scan, the data acquisition server 630 may be programmed to produce such information and to convey it to the pulse sequence server 628. For example, during pre-scans, magnetic resonance data may be acquired and used to calibrate the pulse sequence performed by the pulse sequence server 628. As another example, navigator signals may be acquired and used to adjust the operating parameters of the RF system 610 or the gradient system 606, or to control the view order in which k-space is sampled.

The data processing server 632 receives magnetic resonance data from the data acquisition server 630 and processes the magnetic resonance data in accordance with instructions provided by the operator workstation 620. Such processing may include, for example, reconstructing two-dimensional or three-dimensional images by performing a Fourier transformation of raw k-space data, performing other image reconstruction algorithms (e.g., iterative reconstruction algorithms), applying filters to raw k-space data or to reconstructed images, and so on.

Images reconstructed by the data processing server 632 can be conveyed back to the operator workstation 620 for storage. Real-time images may be stored in a data base memory cache, from which they may be output to operator display 622 or to a separate display 646. Batch mode images or selected real-time images may also be stored in a data storage 648, which may be a host database containing a disc storage. When such images have been reconstructed and transferred to storage, the data processing server 632 may notify the data store server 634 on the operator workstation 620. The operator workstation 620 may be used by an operator to archive the images, produce films, or send the images via a network to other facilities.

The MRI system 600 may also include one or more networked workstations 650. For example, a networked workstation 650 may include a display 652, one or more input devices 654 (e.g., a keyboard, a mouse), and a processor 656. The networked workstation 650 may be located within the same facility as the operator workstation 620, or in a different facility, such as a different healthcare institution or clinic.

The networked workstation 650 may gain remote access to the data processing server 632 or data store server 634 via the communication system 636. Accordingly, multiple networked workstations 650 may have access to the data processing server 632 and the data store server 634. In this manner, magnetic resonance data, reconstructed images, or other data may be exchanged between the data processing server 632 or the data store server 634 and the networked workstations 650, such that the data or images may be remotely processed by a networked workstation 650.

The present disclosure has described one or more preferred embodiments, and it should be appreciated that many equivalents, alternatives, variations, and modifications, aside from those expressly stated, are possible and within the scope of the invention.

The invention claimed is:

1. A method for producing an image with a magnetic resonance imaging (MRI) system, the steps of the method comprising:
    (a) providing RF amplitude scaling data to the MM system, the RF amplitude scaling data containing RF amplitude scaling factors that define an RF amplitude scaling to apply for a particular transmit frequency;
    (b) acquiring data from a subject with the MRI system by performing a magnetic resonance pulse sequence that includes generating at least one RF pulse with an RF transmit coil, wherein an amplitude of the at least one RF pulse is scaled using the provided RF amplitude scaling data to correct for a non-uniform transmit power response of the RF transmit coil;
    (c) reconstructing an image of the subject from the acquired data.

2. The method as recited in claim 1, wherein providing the RF amplitude scaling data to the MM system comprises retrieving previously computed RF amplitude scaling data from a data storage.

3. The method as recited in claim 2, wherein the data storage comprises a memory.

4. The method as recited in claim 1, wherein providing the RF amplitude scaling data to the MM system comprises providing transmit power response data for the RF transmit coil to the MM system and computing the RF amplitude scaling data as RF amplitude scaling factors from the transmit power response data, wherein the transmit power response data defines an amount by which RF power transmitted by the RF transmit coil changes as a function of transmit frequency.

5. The method as recited in claim 4, wherein the RF amplitude scaling factors are computed by computing a mathematical inverse of the transmit power response data.

6. The method as recited in claim 4, wherein providing the transmit power response data to the MM system comprises measuring a peak RF power for the RF transmit coil over a range of transmit frequencies.

7. The method as recited in claim 1, wherein a duration of the at least one RF pulse is increased when the amplitude of the at least one RF pulse as scaled by the RF amplitude scaling data results in a peak RF power that exceeds a maximum threshold value.

8. The method as recited in claim 7, wherein the amplitude of the at least one RF pulse is scaled by a different RF scaling factor in the RF amplitude scaling data based on the increased duration of the at least one RF pulse.

9. A method for computing radiofrequency (RF) scaling factors for correcting a non-uniform transmit power response of an RF transmit coil used in a magnetic resonance imaging (MM) system, the steps of the method comprising:
    (a) providing transmit power response data for the RF transmit coil to a computer system, wherein the transmit power response data define an amount by which RF power transmitted by the RF transmit coil changes as a function of transmit frequency;
    (b) computing RF amplitude scaling factors with the computer system by computing a mathematical inverse of the transmit power response data; and
    (c) storing the RF amplitude scaling factors in the computer system as RF amplitude scaling data for later use by the Mill system.

10. The method as recited in claim 9, wherein providing the transmit power response data to the computer system comprises retrieving previously measured transmit power response data from a data storage.

11. The method as recited in claim 10, wherein the data storage comprises a memory.

12. The method as recited in claim 9, wherein providing the transmit power response data to the computer system comprises measuring a peak RF power for the RF transmit coil over a range of transmit frequencies.

13. The method as recited in claim 12, wherein providing the transmit power response data to the computer system comprises measuring the peak RF power for the RF transmit coil over a range of transmit frequencies at each of a plurality of different main magnetic field strengths.

14. A method for producing radiofrequency (RF) transmit pulse waveforms for use with a magnetic resonance imaging (MM) system that includes an RF transmit coil, the steps of the method comprising:
    (a) providing transmit power response data for the RF transmit coil to a computer system, wherein the transmit power response data defines an amount by which RF power transmitted by the RF transmit coil changes as a function of transmit frequency;
    (b) computing RF amplitude scaling factors with the computer system based at least in part on the transmit power response data; and
    (c) generating an RF transmit pulse waveform based at least in part on:
        a pulse duration selected with the computer system;
        a transmit frequency selected with the computer system;
        an amplitude selected with the computer system and scaled using the RF amplitude scaling factor associated with the selected transmit frequency.

15. The method as recited in claim 14, wherein the pulse duration selected by the computer system is increased when the scaled amplitude results in a peak RF power that exceeds a threshold value.

16. The method as recited in claim 15, wherein the increased pulse duration results in selecting a different transmit frequency such that the amplitude is scaled by a different RF amplitude scaling factor that results in a lower peak RF power.

* * * * *